Dec. 12, 1961 P. R. JONES 3,013,186

RESILIENT LIGHTWEIGHT ELECTRONIC CHASSIS AND HEAT EXCHANGER

Filed Jan. 26, 1959 2 Sheets-Sheet 1

INVENTOR.

PAUL R. JONES

BY Marvin Moody
ATTORNEY

Glenn H. Antrim
AGENT

RESILIENT LIGHTWEIGHT ELECTRONIC CHASSIS AND HEAT EXCHANGER

Filed Jan. 26, 1959 2 Sheets-Sheet 2

INVENTOR.
PAUL R. JONES
BY Marvin Moody
ATTORNEY
Glenn H. Antrim
AGENT

United States Patent Office 3,013,186
Patented Dec. 12, 1961

3,013,186
RESILIENT LIGHTWEIGHT ELECTRONIC CHASSIS AND HEAT EXCHANGER

Paul R. Jones, Cedar Rapids, Iowa, assignor to Collins Radio Company, Cedar Rapids, Iowa, a corporation of Iowa Filed Jan. 26, 1959, Ser. No. 789,164
3 Claims. (Cl. 317—100)

This invention pertains to modular chassis for mounting electronic component parts, and more particularly to light-weight plastic chassis that have heat conductive inserts for transferring heat from the component parts to a fluid stream.

In compact equipment that is to be mounted in aircraft, modular chassis that are fabricated from lightweight metal have been used for the mounting of electronic component parts. The metal provides necessary heat conduction for cooling the parts that are mounted within the chassis and also provides electrical shielding of the component parts and their interconnections from each other and from external electrical fields. These chassis, although fabricated from lightweight metal, become noticeably heavy as a result of the amount of metal that is required to provide sufficient rigidity for protecting mounted electronic component parts during periods of high acceleration. A maximum degree of protection can be obtained for the mounted parts during vibration or high linear acceleration if the chassis has considerable resilience for absorbing shock. Chassis fabricated according to the present invention have a supporting structure of plastic foam that is strong, resilient, and very lightweight. The surface of the plastic foam may be plated to provide shielding and grounding connections, and lightweight metal inserts may be molded into the plastic foam to conduct heat from component parts to a stream of cooling fluid.

An object of the present invention is to provide resilient chassis for mounting electronic parts that are to be protected from shock during high acceleration.

Another object is to provide fluid cooling systems in lightweight chassis that are fabricated mainly from low heat conductive materials.

And still another object is to provide electronic shielding for chassis that are fabricated mainly from materials that are electronically nonconductive.

The following description and the appended claims may be more readily understood with reference to the accompanying drawings in which:

Figure 1:
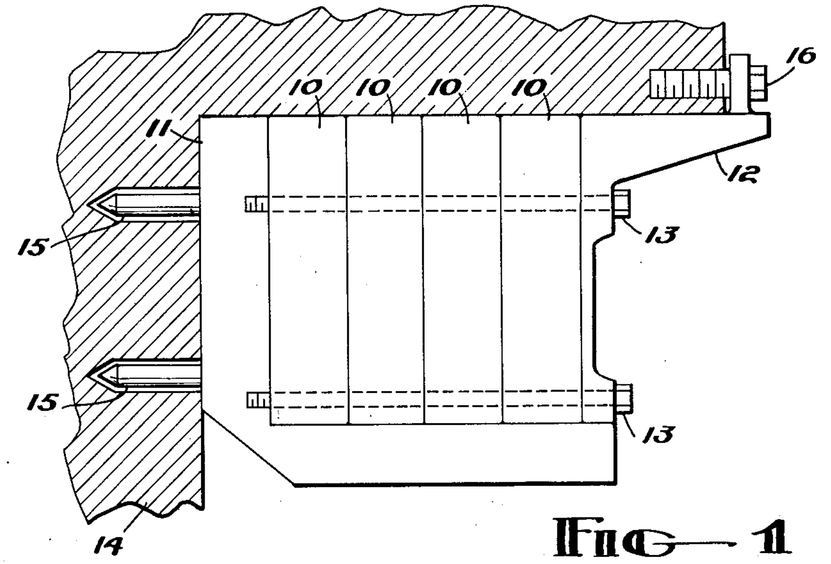
FIGURE 1 is a side view of equipment that comprises a plurality of modular chassis rigidly clamped together.

The equipment shown in FIGURE 1 comprises a plurality of plastic foam chassis 10 sandwiched between mounting plate 11 and end plate 12. The chassis are securely clamped to withstand vibration by two pairs of mounting bolts 13 that extend through each end of the chassis. The equipment is mounted to mounting rack 14 by rear mounting pins 15 and front mounting bolts 16.

Figure 2:
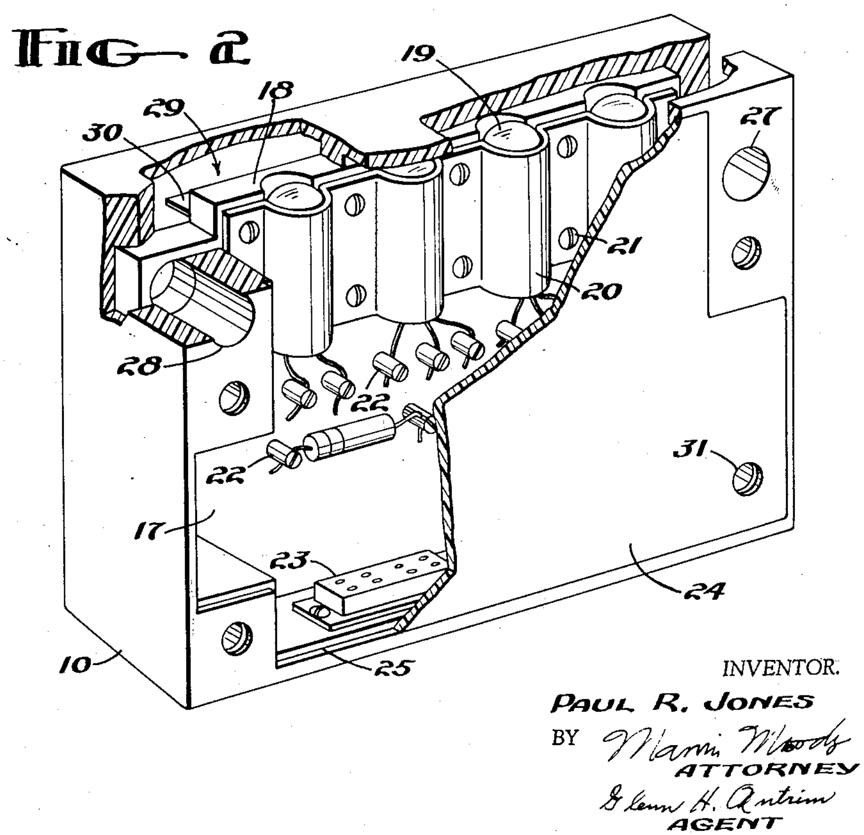
FIGURE 2 is an oblique view of a modular chassis that has a portion cut away to show the internal arrangement of component parts and the associated cooling system.

In FIGURE 2, the plastic foam chassis is divided into two portions by a dividing wall that consists of an insulating portion 17 and a heat conducting portion 18. Portion 17, to which connecting terminals 22 are mounted, is most conveniently molded plastic foam of the same materials as the outside walls of the chassis. The outside walls are generally metal plated but the intermediate wall may be masked during the plating process so that it does not receive a metal deposit. Electronic parts that dissipate the greatest amount of heat, for example electron tubes 19, are mounted to the heat conductive portion 18 that functions as a heat exchanger.

The tubes shown in FIGURE 2 are tightly clamped in recesses by a metallic clamp 20 that is secured to the main portion of the heat exchanger 18 by screw fasteners 21. The terminals of the electron tubes 19 and other component parts of the circuitry are connected to mounting posts 22 which may be mounted either by being molded as inserts into the plastic foam wall, or by drilling the plastic foam and using conventional retaining means. Printed circuits may be applied directly to the dividing wall 17 or separate printed boards may be attached. A multi-terminal connector 23 may be mounted in the lower wall of the chassis for completing external connections through a mating connector (not shown) that is mounted on the lower portion of mounting plate 11.

The compartment in which the electronic parts are mounted is hermetically sealed by a thin metal front cover 24 that is inserted within a rabbit 25 that is molded within the inner edge of the outer walls of the chassis. In order to provide a hermetic seal, the plate 24 is most conveniently soldered to the rabbeted edges that have been plated. Fluid ducts 27 and 28 that communicate with a rear fluid cooling compartment 29 are arranged to communicate with corresponding ducts of adjacently mounted chassis. Through this arrangement, fluid can be circulated through all compartments that exist between adjacent chassis. The cooling fluid flows over fins 30 that are part of heat exchanger 18 and also flows through additional space of compartment 29 that is formed between the front cover 24 and a rear cover 32 of adjacent chassis. The compartment 29 that is provided between the chassis for cooling is more clearly shown in FIGURE 3.

Figure 3:
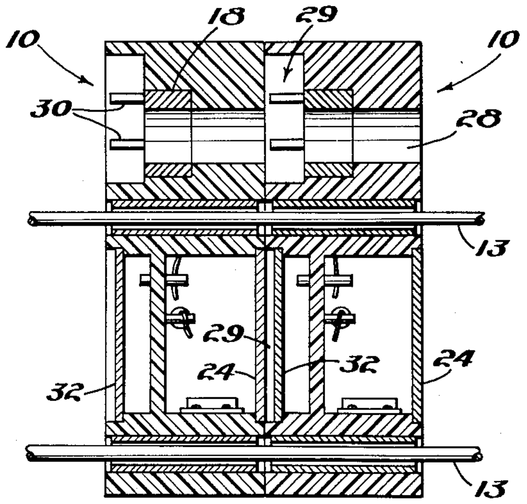
FIGURE 3 is a sectional end view of two adjacently mounted modular chassis with the section being taken through two end mounting bolts.

The rear plate 32 of FIGURE 3 is recessed in a rabbet so that the mounting edges about the periphery of the chassis provide a tight seal between the chassis and form compartment 29 between the front and rear covers of adjacent chassis. Preferably, the portions surrounding the mounting holes 31 are embossed slightly so that when the chassis are clamped tightly together they are securely held by the mounting bolts without distorting the chassis.

Figure 4:
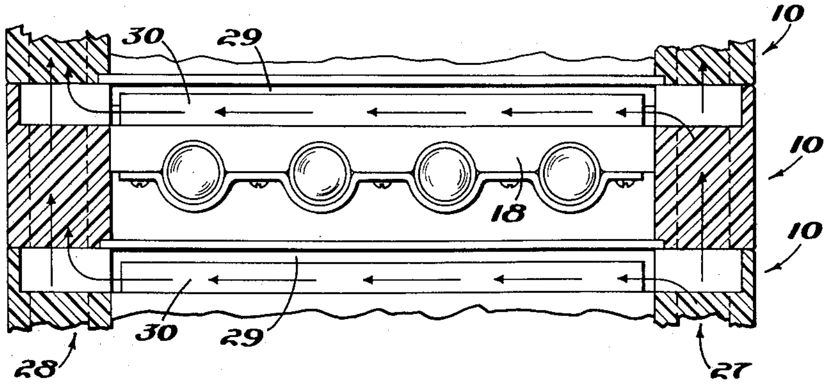
FIGURE 4 is a sectional top view of a modular chassis with the top outer wall being removed.

The fluid flow for cooling the chassis is clearly shown in FIGURE 4. Obviously, ducts 27 and 28 may be used interchangeably for the intake or for the exhaust. In this example, fluid flows through the intake 27 and through the compartment 29 that exists between adjacent chassis. Maximum cooling is provided by the flow of fluid over fins 30 at the outer portion of the heat exchanger 18. Obviously, the exact configuration of the chassis that is shown in the accompanying drawings may be varied according to the parts there to be mounted. Other types of cooling surfaces, for example corrugated sheets, may be substituted for fins 30.

Presently a variety of plastic materials that are suitable for fabricating modular plastic foam chassis are available commercially. Usually, a base material and an activator of a desired material are pressed into the chassis mold. A reaction resulting between the base material and the activator produces a gas that converts the material to either open- or closed-cell foam. Plastic material may be selected according to the degree of rigidity, compressive strength, and elasticity that is required for a particular application. In certain materials proper rebound elasticity may be obtained so that the characeristic of absorbing shock continues after equipment fabricated from the material has endured repeated conditions of acceleration. The plastic that is to be foamed in place may be selected from such materials as polyurethane, isocyanates, phenolic, silicones, or polyvinyl chloride.

Figure 5:
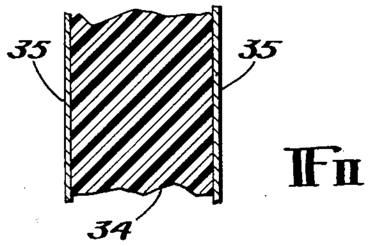
FIGURE 5 is a cross-section of a wall of a chassis to show conductive plating.

Different well-known processes may be used for applying a conductive coating 35 to the plastic foam wall 34 of FIGURE 5. For example, a satisfactory plating may be obtained by first applying a thermosetting cement and then successively applying by chemical deposition a thin layer of copper and a thin layer of silver. Conductive metals may also be applied by vacuum plating, by plating over an application of conductive paint, or by spraying with molten metal.

Chassis fabricated as described herein are economical to manufacture and provide shock resistant mounting for electronic parts. The heat insulating qualities of the plastic foam from which the outer walls are fabricated are particularly useful when the chassis houses electronic equipment that is operated at high ambient temperatures and which depends upon refrigeration equipment for cooling. Obviously, since the plastic foam is nearly as good an insulator as dry air, little heat is transmitted from the surrounding atmosphere to the electronic components so that the cooling system need remove little heat in addition to that dissipated by the electronic circuitry contained within the chassis. The chassis also isolates component parts that dissipate little heat from those that dissipate considerable heat. The molded construction provides convenient means for separating the chassis into a hermetically sealed portion and into a fluid cooling portion. Through this arrangement the compartment containing the electronic components is isolated from the ambient atmosphere and the components therefore may be operated at any desired pressure and be protected from humidity. The heat from the compartment in which the electronic components are mounted may be readily transmitted through a lightweight heat conductor to the fluid cooling portion. The application of different fittings to the fluid cooling ducts of the equipment permits either a gas or a liquid to be circulated through the heat exchanger for cooling.

When modular units that utilize plastic foam are manufactured in large quantities, the cost is so low that the unit may be considered to be disposable when it becomes inoperative. Electronic equipment comprising these modular chassis may then be repaired by quickly replacing a defective modular chassis with a new one.

Although the chassis of this invention has been described with reference to a single embodiment, the chassis may be changed in obvious ways for application to different equipments and still be within the sphere and scope of the following claims.

I claim:

1. A modular chassis having an outer peripheral structural wall molded from shock-resistant thermally insulated plastic foam, a dividing wall having its edges molded into said peripheral wall to provide a hermetically sealed partition separating the chassis into front and rear compartments, said dividing wall including a first portion of shock-resistant thermally insulated plastic foam providing mounting means for electronic parts and a second portion providing a metallic heat exchanger for conducting heat from said front compartment to said rear compartment, a front cover attached to the front edge of said peripheral wall for enclosing said front compartment, the front and rear edges of said peripheral wall being adapted for mounting tightly against the edges of peripheral walls of similar adjacent chassis, a plurality of fluid ducts communicating with said rear compartment to provide means for circulating fluid over said heat exchanger, and means adapting said ducts for communciating with similar ducts of adjacently mounted chassis for circulating fluid over said front cover.

2. A chassis as claimed in claim 1 wherein said structural walls are metal plated.

3. A chassis as claimed in claim 1 wherein said front cover is a metallic plate soldered to the front edge of said structural wall for hermetically sealing said front compartment.

References Cited in the file of this patent

UNITED STATES PATENTS

| | | |
|---|---|---|
| 2,815,472 | Jackson | Dec. 3, 1957 |
| 2,836,772 | Wintrode | May 27, 1958 |
| 2,843,806 | O'Neill | July 15, 1958 |
| 2,893,704 | Passman | July 7, 1959 |
| 2,942,856 | Woodward | June 28, 1960 |

OTHER REFERENCES

Electrical Manufacturing, December 1958, "Techniques of Cooling Electronic Equipment."